(12) United States Patent (10) Patent No.: US 12,598,806 B2
Jang et al. (45) Date of Patent: Apr. 7, 2026

(54) TEMPERATURE SENSOR CIRCUIT AND DISPLAY APPARATUS INCLUDING THE SAME

(71) Applicant: UNIVERSITY-INDUSTRY COOPERATION GROUP OF KYUNG HEE UNIVERSITY, Yongin-si (KR)

(72) Inventors: Jin Jang, Seoul (KR); Yuanfeng Chen, Seoul (KR); Su Hui Lee, Seoul (KR)

(73) Assignee: UNIVERSITY-INDUSTRY COOPERATION GROUP OF KYUNG HEE UNIVERSITY, Yongin-si (KR)

( * ) Notice: Subject to any disclaimer, the term of this patent is extended or adjusted under 35 U.S.C. 154(b) by 550 days.

(21) Appl. No.: 17/237,135

(22) Filed: Apr. 22, 2021

(65) Prior Publication Data

US 2022/0136908 A1     May 5, 2022

(30) Foreign Application Priority Data

Oct. 29, 2020     (KR) ........................ 10-2020-0142270

(51) Int. Cl.
  *H10D 86/40*          (2025.01)
  *G01K 7/01*           (2006.01)
      (Continued)

(52) U.S. Cl.
  CPC ........... *H10D 86/423* (2025.01); *G01K 7/015* (2013.01); *G02F 1/133382* (2013.01);
      (Continued)

(58) Field of Classification Search
  CPC ........................ G02F 1/133382; G02F 2203/60
  See application file for complete search history.

(56) References Cited

U.S. PATENT DOCUMENTS 9,508,446 B1 * 11/2016 Chen .................. G11C 16/0483
2019/0226920 A1 * 7/2019 Zhao ........................ G01K 7/32

FOREIGN PATENT DOCUMENTS

CN          106768437 A     5/2017
EP          2-450954      * 10/2011   ............. H01L 27/12
          (Continued)

OTHER PUBLICATIONS

Notice of Allowance dated Feb. 27, 2023 in Korean Application No. 10-2020-0142270.
          (Continued)

*Primary Examiner* — Lauren Nguyen
(74) *Attorney, Agent, or Firm* — Sughrue Mion, PLLC

(57)          ABSTRACT

The present disclosure relates to a temperature sensor circuit for measuring temperature change inside a pixel of a high-brightness active matrix micro-light-emitting diode (micro-LED) display, and a display apparatus including the temperature sensor circuit. The temperature sensor circuit according to one embodiment of the present disclosure includes a first thin film transistor, a second thin film transistor interconnected with the first thin film transistor, and a temperature measurement unit for measuring temperature based on an output voltage according to difference in off current between the first thin film transistor and the second thin film transistor.

18 Claims, 14 Drawing Sheets

200

(51) Int. Cl.
    *G02F 1/1333*     (2006.01)
    *H10D 30/67*     (2025.01)
    *H10K 59/121*     (2023.01)

(52) U.S. Cl.
    CPC ..... *H10D 30/6713* (2025.01); *H10D 30/6757* (2025.01); *H10K 59/1213* (2023.02); *G02F 2203/60* (2013.01)

(56)           References Cited

FOREIGN PATENT DOCUMENTS

| EP | 2 450 954 A1 | 5/2012 |
|----|----|----|
| JP | 2018-87888 A | 6/2018 |
| JP | 2018-107444 A | 7/2018 |
| KR | 10-1738780 B1 | 5/2017 |
| KR | 10-2019-0027057 A | 3/2019 |
| KR | 10-2061789 B1 | 1/2020 |

OTHER PUBLICATIONS

Communication dated Jun. 20, 2022 from the Korean Intellectual Property Office in Application No. 10-2020-0142270.
Hyun-Sik Kim et al., "High-Linearity In-Pixel Thermal Sensor Using Low-Temperature Poly-Si Thin-Film Transistors", IEEE Sensors Journal, Feb. 2015, vol. 15, No. 2, pp. 963-970 (8 pages total).
Hyunho Kim et al., "A High-Gain Inverter With Low-Temperature Poly-Si Oxide Thin-Film Transistors", IEEE Electron Device Letters, Mar. 2019, vol. 40, No. 3, pp. 411-414 (4 pages total).
Office Action dated Nov. 8, 2022 issued in Korean Application No. 10-2020-0142270.

* cited by examiner

【FIG. 1】
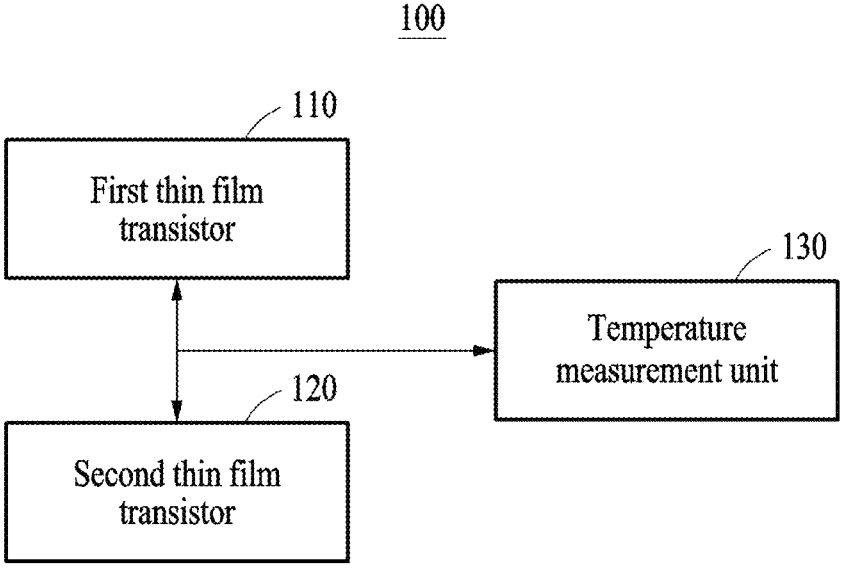
【FIG. 2A】
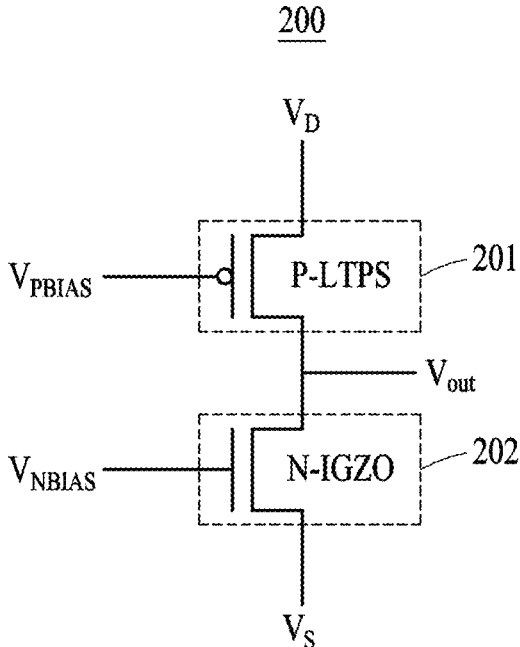

【FIG. 2B】
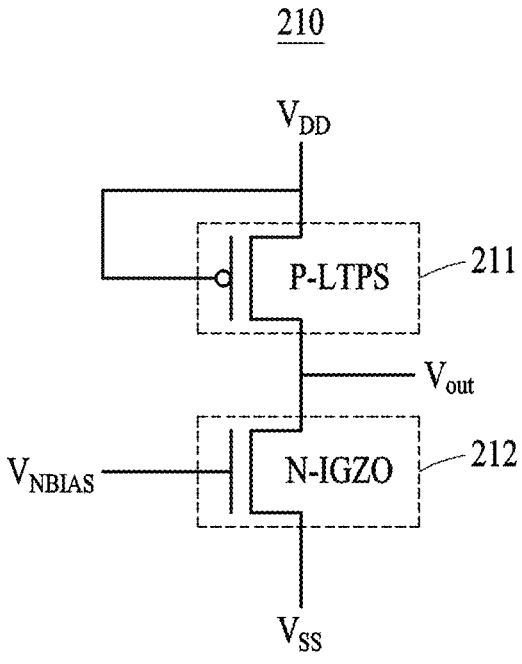
210
【FIG. 2C】
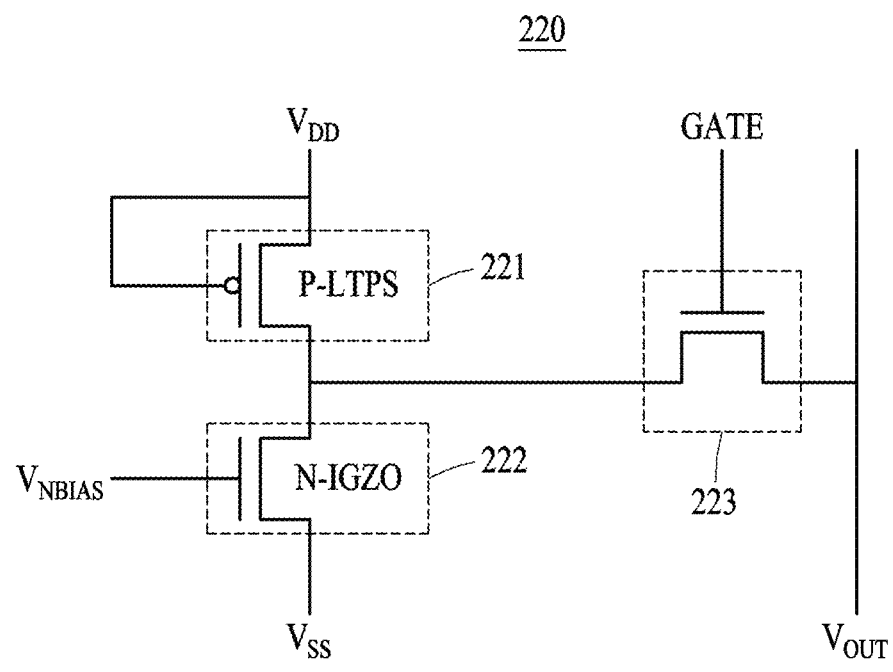
220

【FIG. 2D】
220
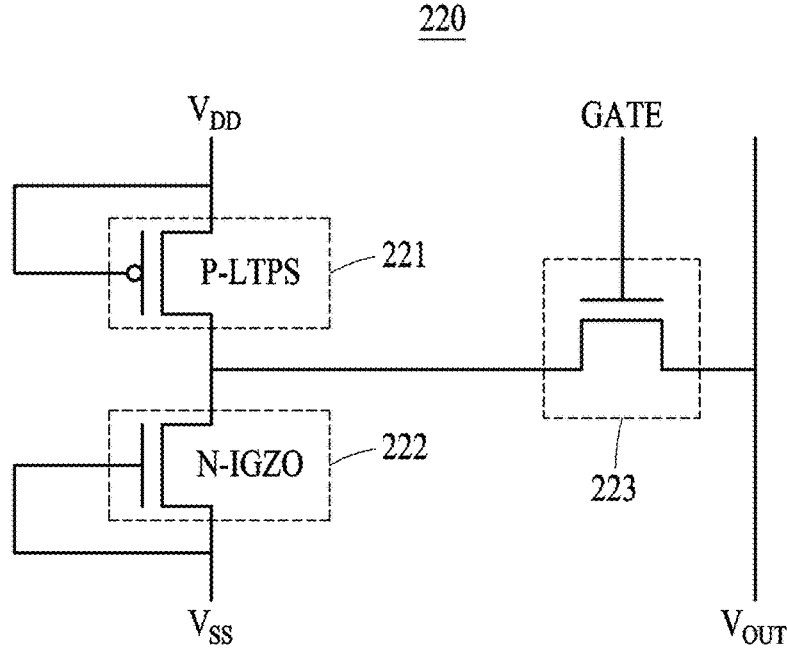
【FIG. 3】
300
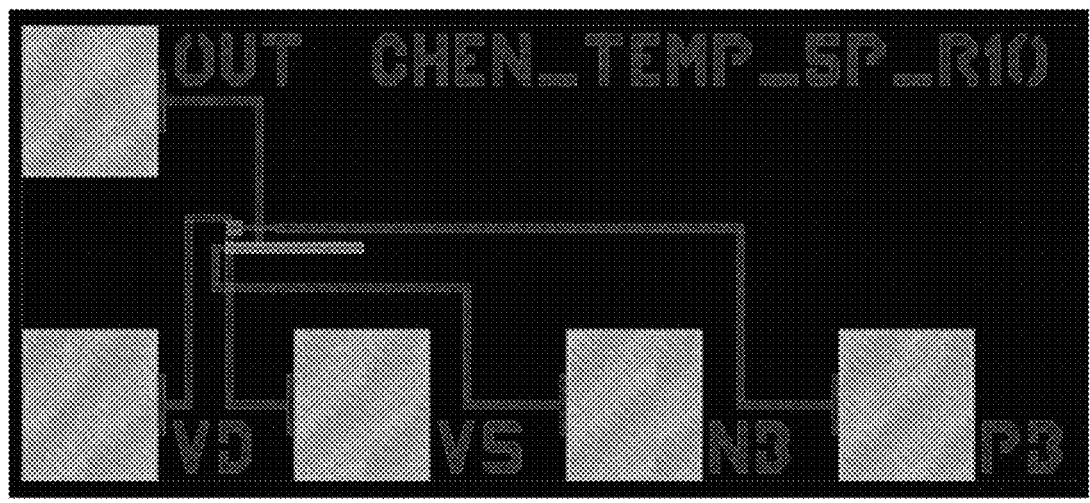

【FIG. 4】
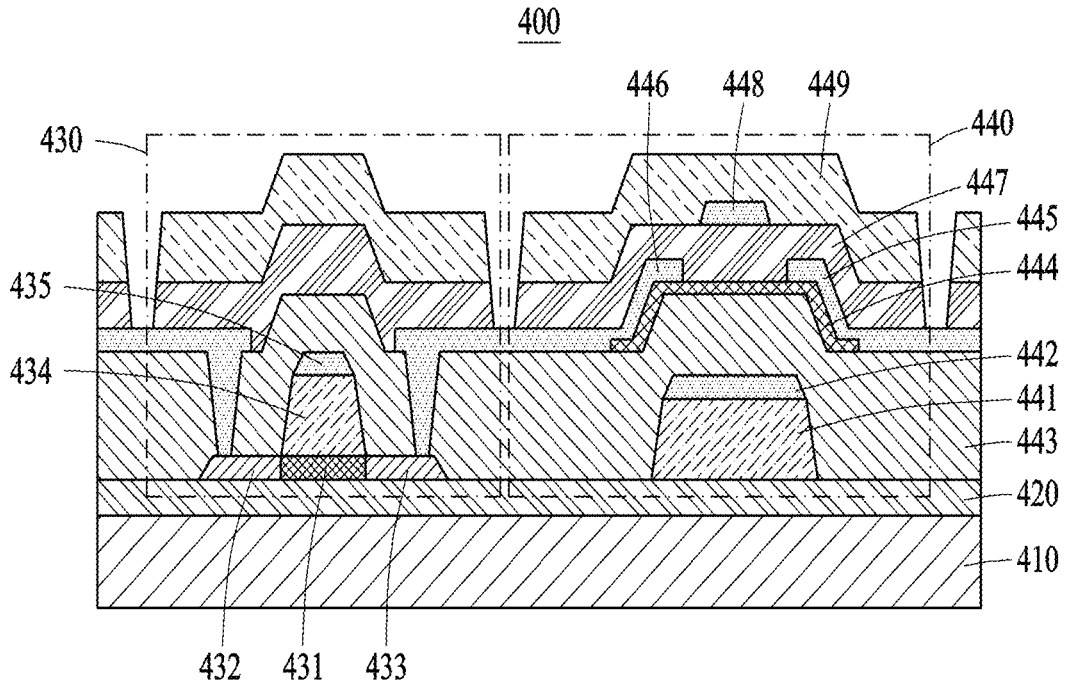

【FIG. 5A】
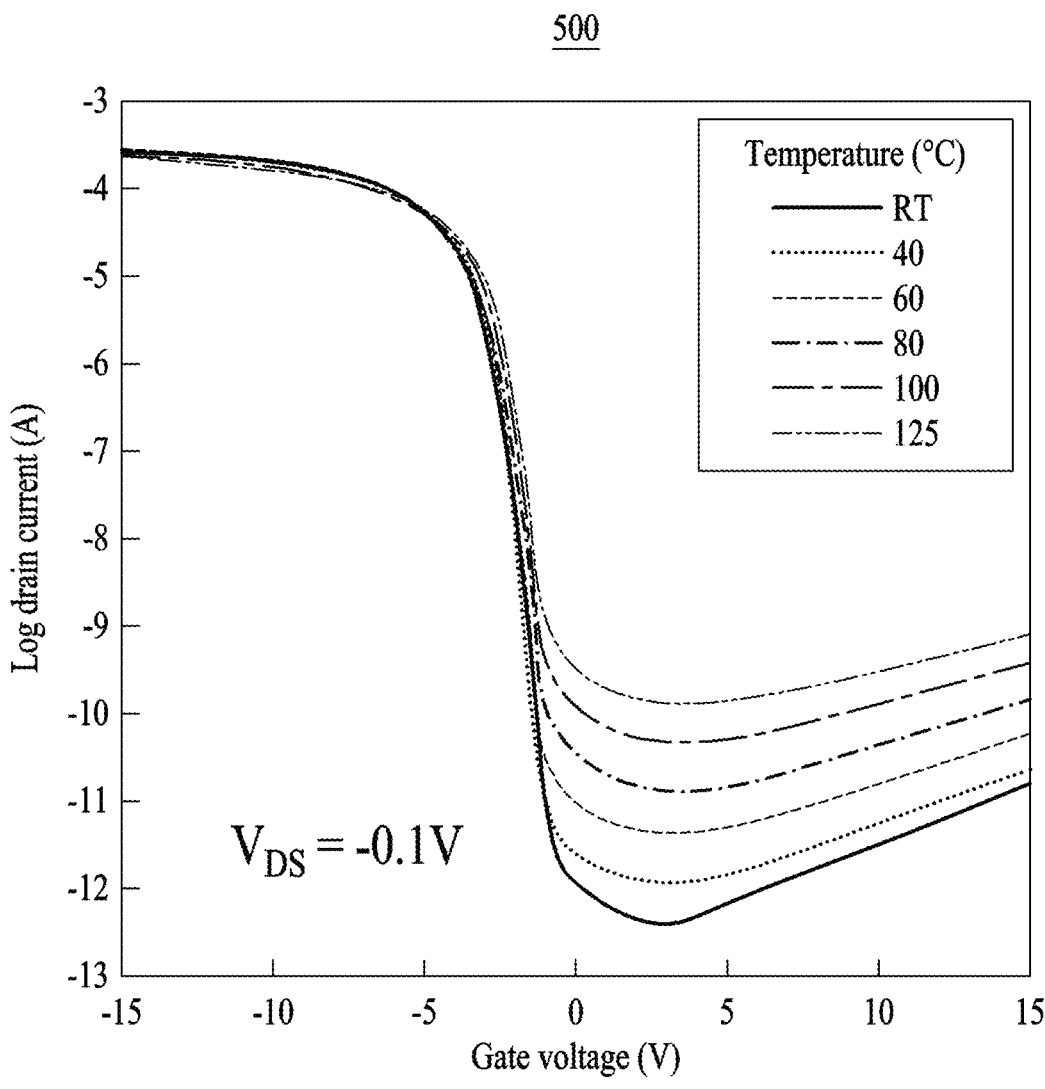

[FIG. 5B]
510
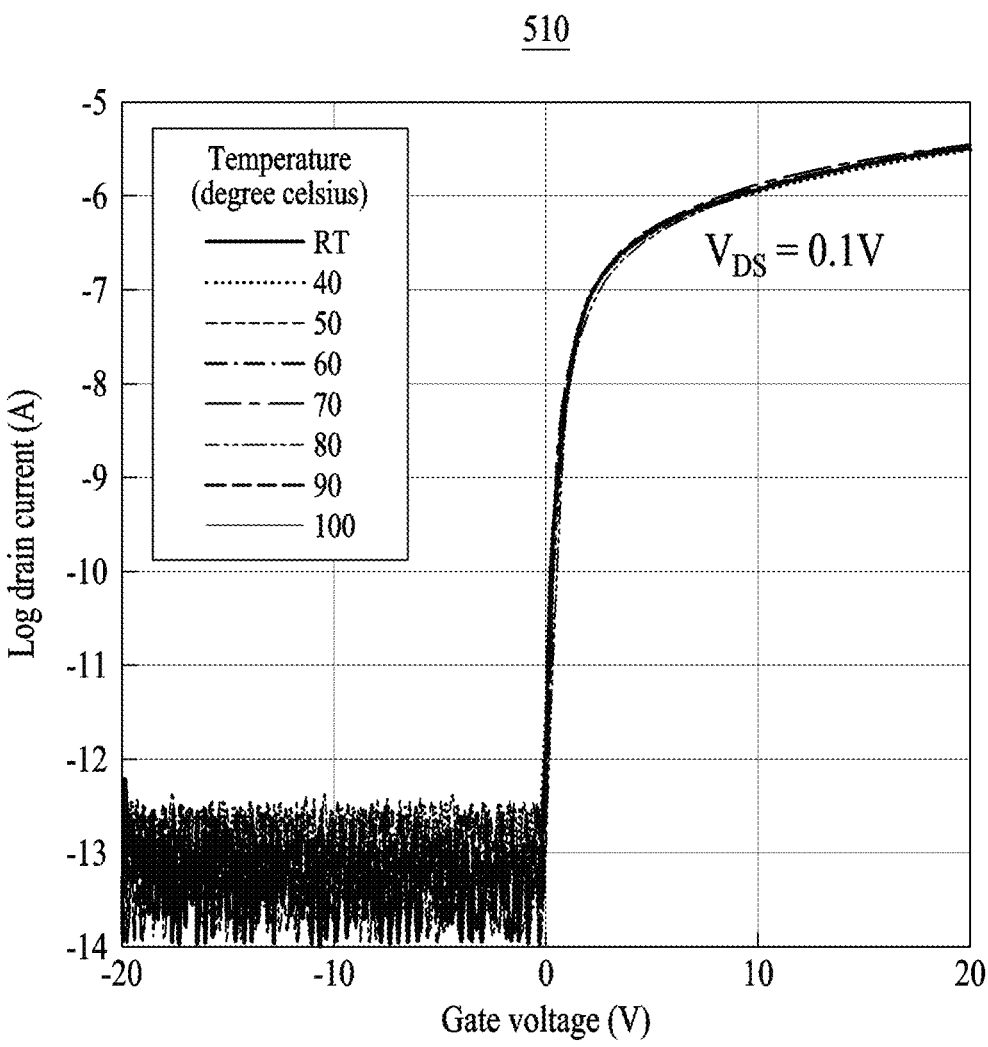

【FIG. 6A】
600
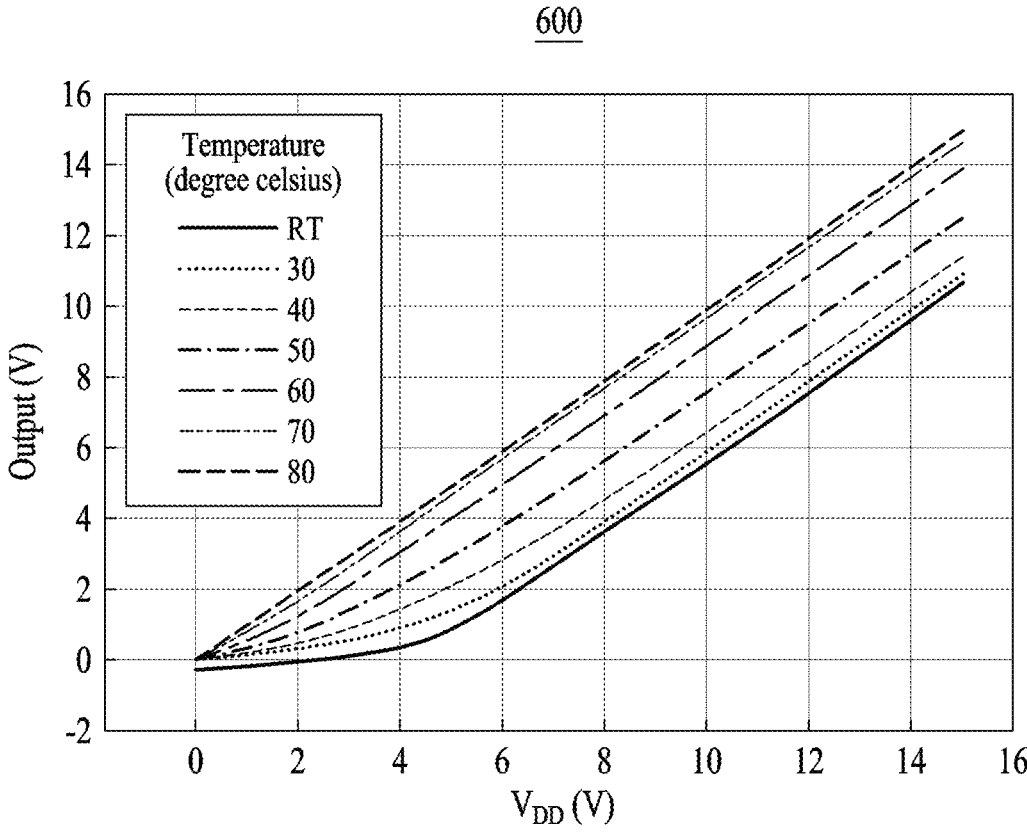

【FIG. 6B】
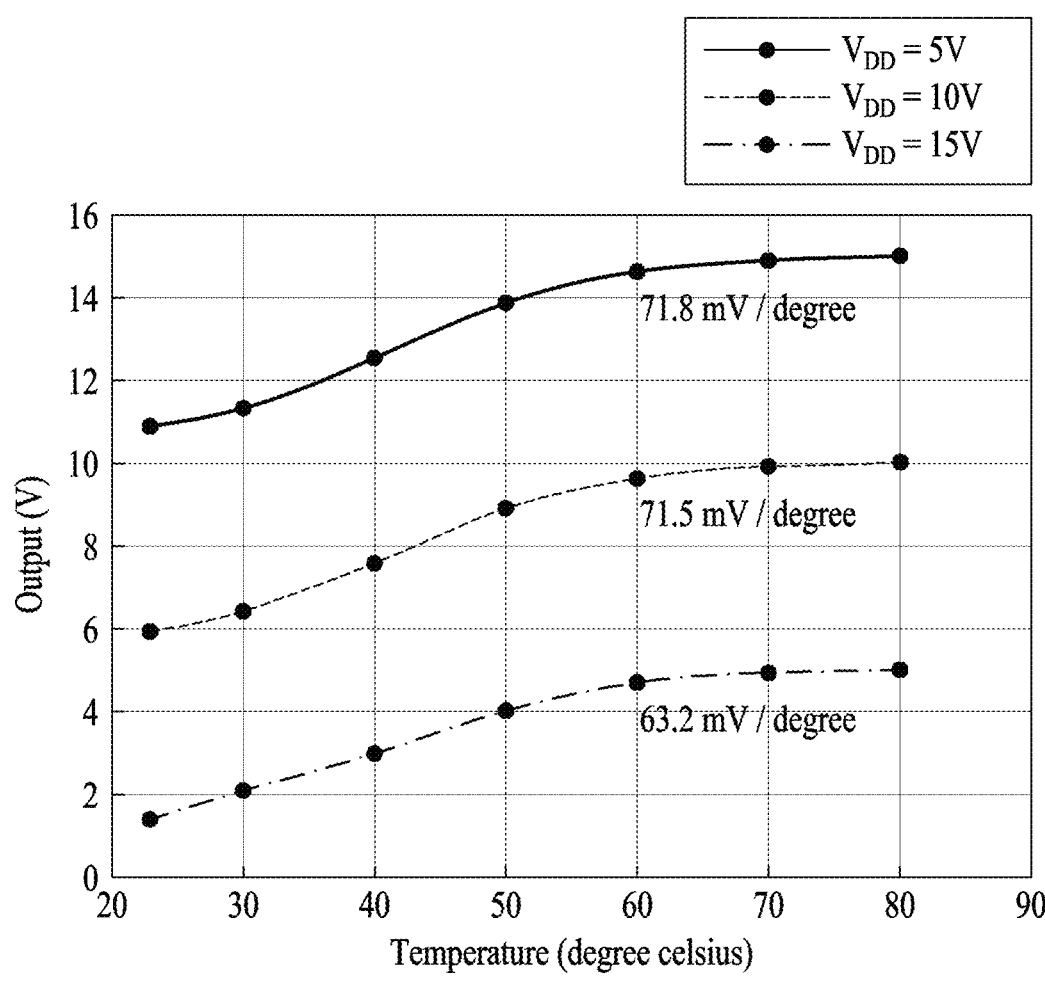

【FIG. 6C】
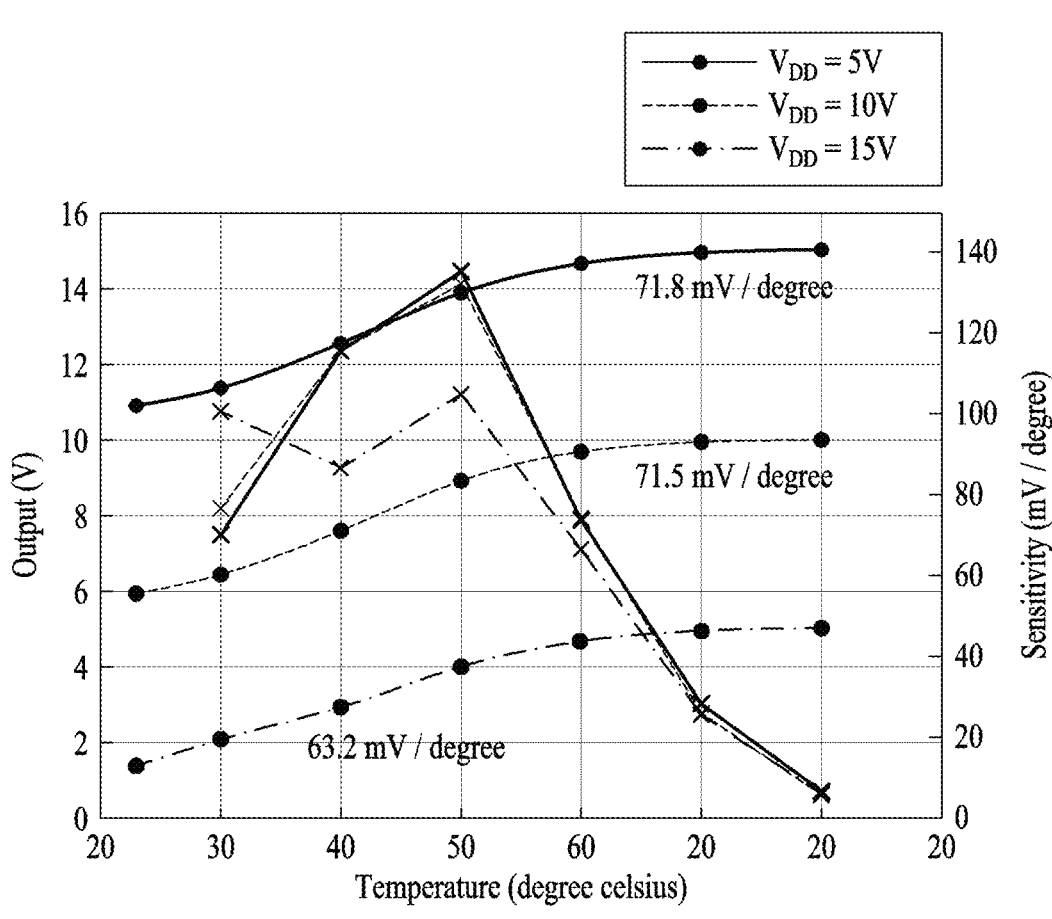

【FIG. 7】
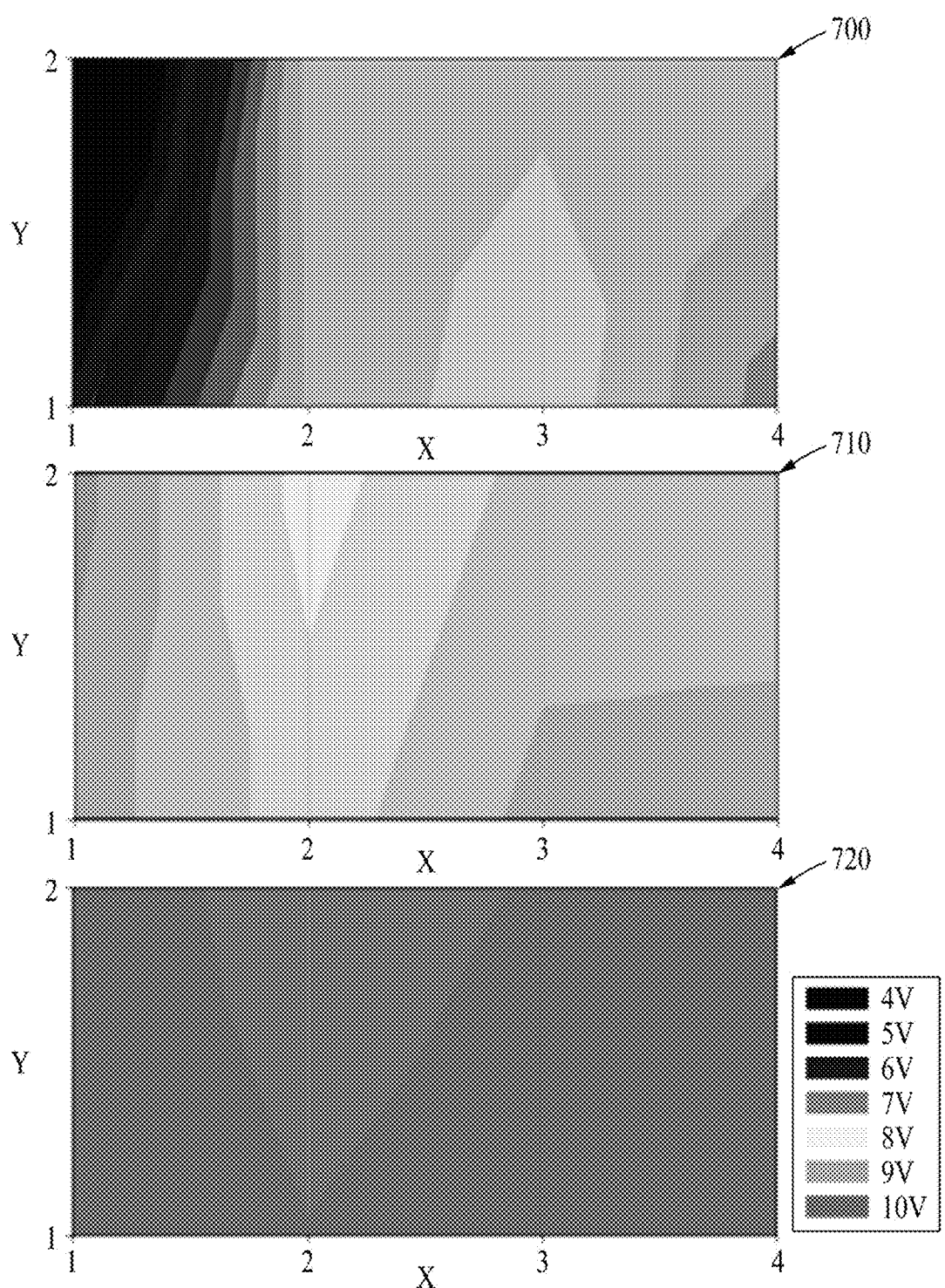

【FIG. 8】
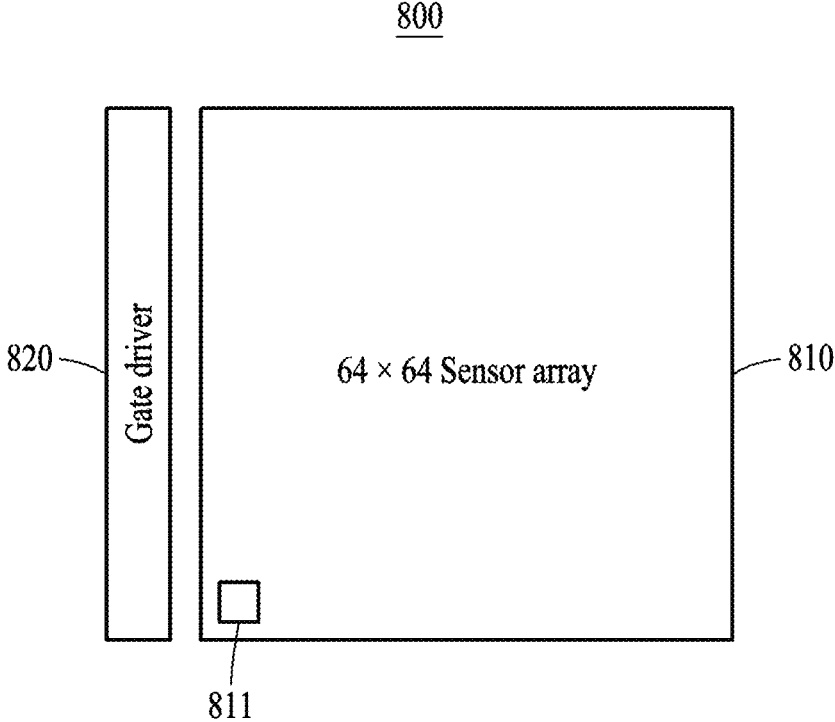
800

【FIG. 9】
900
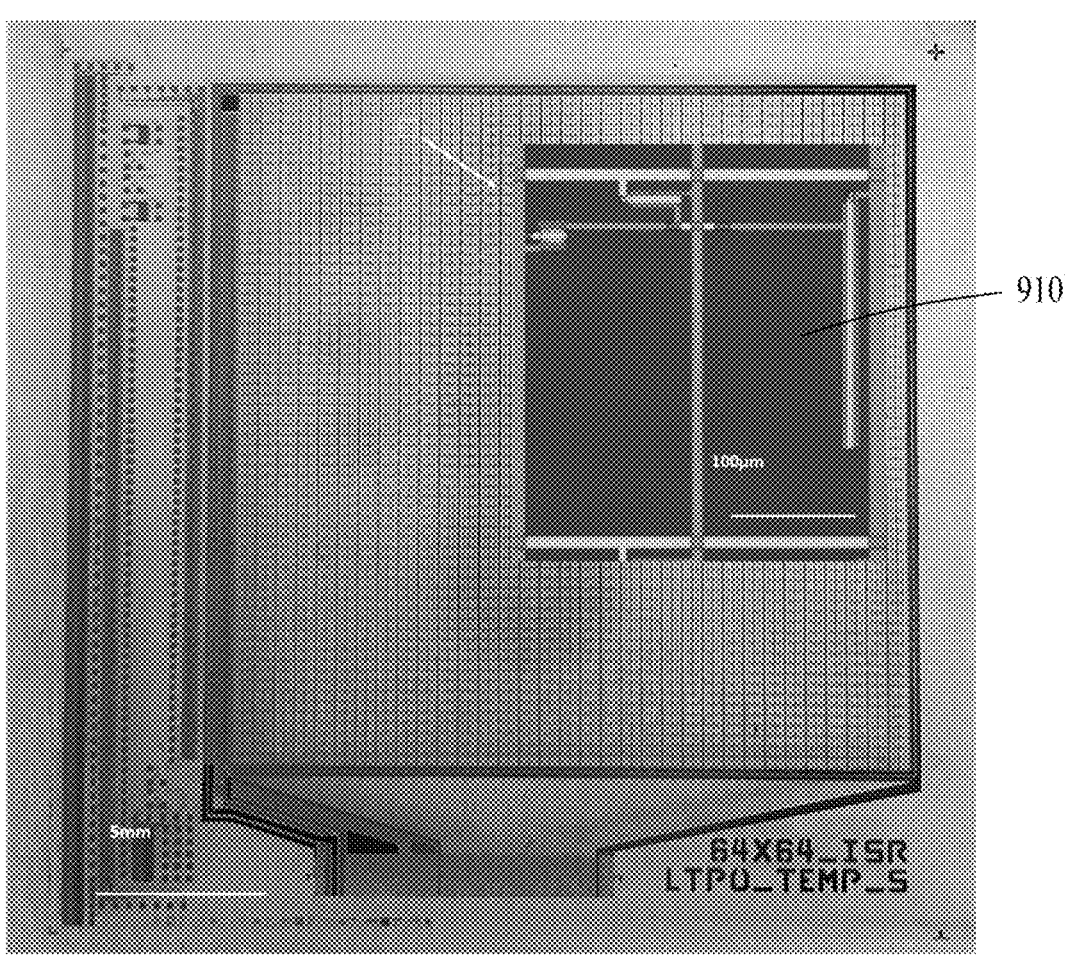

【FIG. 10A】
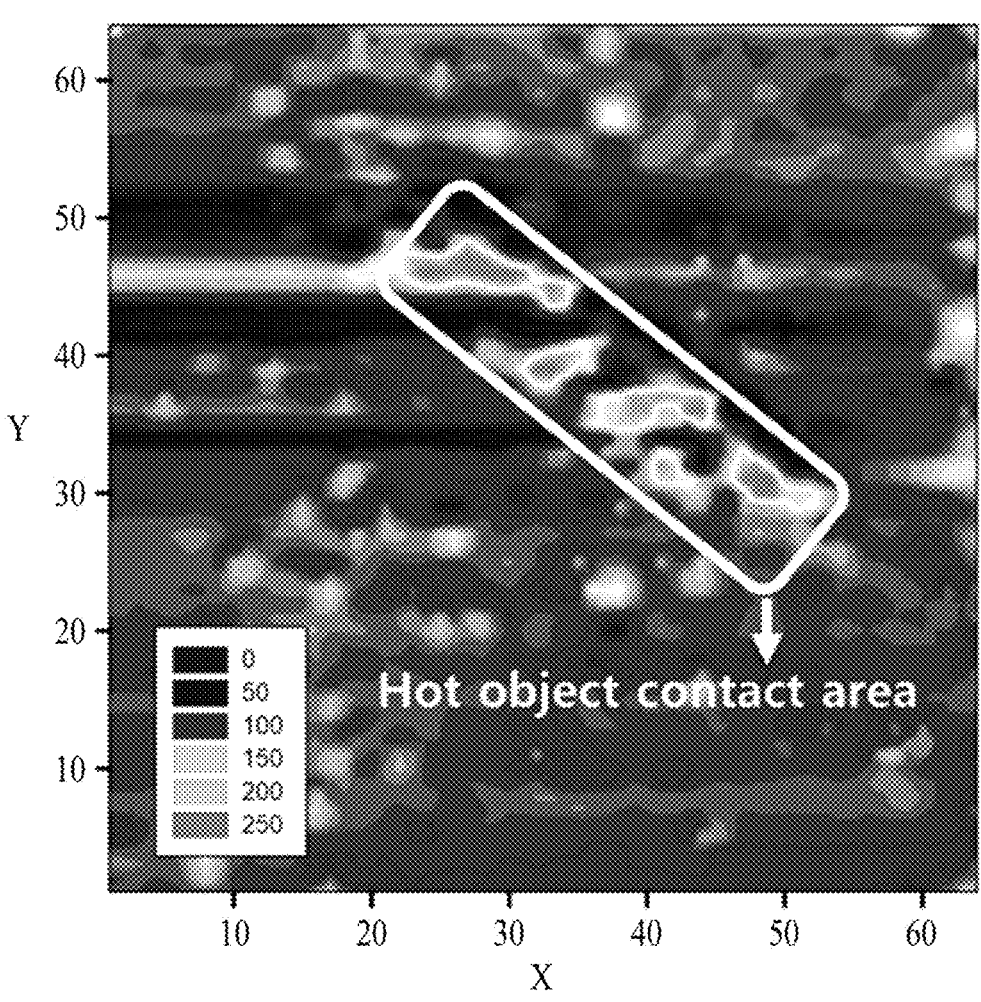
1000

【FIG. 10B】
1010
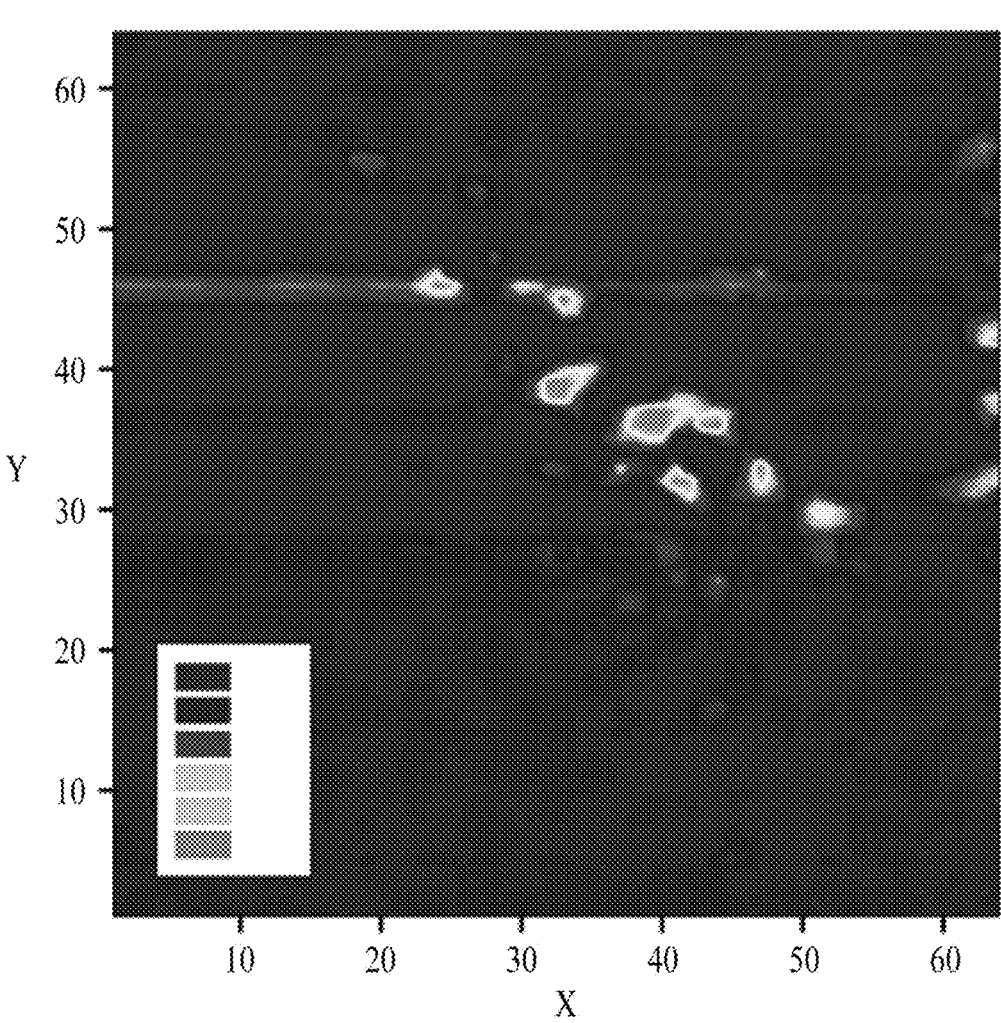

TEMPERATURE SENSOR CIRCUIT AND DISPLAY APPARATUS INCLUDING THE SAME

CROSS-REFERENCE TO RELATED APPLICATION

This application claims priority to Korean Patent Application No. 10-2020-0142270, filed on Oct. 29, 2020 in the Korean Intellectual Property Office, the disclosure of which is incorporated herein by reference.

BACKGROUND OF THE DISCLOSURE

Field of the Disclosure

The present disclosure relates to a temperature sensor circuit for measuring temperature change inside a pixel of a high-brightness active matrix micro-light-emitting diode (micro-LED) display, and a display apparatus including the temperature sensor circuit. More particularly, the present disclosure relates to technology for monitoring temperature change inside a pixel of a high-brightness active matrix micro-LED display by using the off-current characteristics of thin film transistors constituting a temperature sensor circuit according to temperature change.

Description of the Related Art

Micro-light-emitting diodes (micro-LEDs) have advantages such as high efficiency, high brightness, increased lifespan, wide color gamut, narrow emission peak, and expandability, so that micro-LED technology is considered the most promising technology for implementing a next-generation flat panel display.

However, in addition to a method of manufacturing LEDs, the high performance of micro-LEDs is related to maximization of the brightness of a display and design of a backplane.

In the case of organic light-emitting diode (OLED) displays, peak brightness limits usually occur on an OLED itself at low brightness levels (when IR drop is not the main effect of brightness limit), which can be a very common scenario when displaying high dynamic range (HDR) content.

In general, compared to OLED devices, micro-LEDs can maintain high current and brightness without reducing the lifespan thereof. Accordingly, in micro-LEDs, the dominant influence of brightness limit may be considered in terms of thermal management, routing, and other aspects.

In terms of thermal management, when one micro-LED pixel is continuously turned on with a high current, a backplane or an LED may be damaged by accumulated heat.

By setting a fixed current limit, overheating of all pixels may be prevented irrespective of on-duration. However, in this case, the peak brightness that a display can achieve in a short time is limited.

Accordingly, dynamic monitoring of the temperature of a backplane is required to achieve best performance without thermal damage.

Meanwhile, low-temperature polycrystalline oxide (LTPO) thin film transistors (TFTs) have, due to high mobility and low off current thereof, advantages of both low-temperature polycrystalline silicon (LTPS) and oxide technologies.

Accordingly, an LTPO TFT may be a candidate for the backplane of a large active matrix (AM) micro-LED display.

As the disadvantages of the manufacturing technology of LTPO TFTs, an expensive excimer laser annealing (ELA) process is required, and for complex LTPS and an oxide bonding process, the number of masks is increased, which increases manufacturing cost.

Recently, a low-cost LTPS process using a blue laser, which can replace ELA process technology, has been developed, and blue laser annealing (BLA) process technology has been developed. In addition, manufacturing cost may be reduced by reducing the number of masks required for an LTPO process through a shared gate process.

RELATED ART DOCUMENTS

Patent Documents (Patent Document 1) Japanese Patent Application Publication No. 2018-107444, "DISPLAY DEVICE"

(Patent Document 2) Korean Patent No. 10-2061789, "ORGANIC LIGHT-EMITTING DISPLAY APPARATUS AND METHOD OF MEASURING TEMPERATURE USING THE SAME"

(Patent Document 3) European Patent Application Publication No. 2450954, "ARCHITECTURE OF ANALOG BUFFER CIRCUIT"

(Patent Document 4) Korean Patent Application Publication No. 10-2019-0027057, "DISPLAY DEVICE AND PIXEL"

SUMMARY OF THE DISCLOSURE

Therefore, the present disclosure has been made in view of the above problems, and it is an object of the present disclosure to measure temperature change inside a pixel of a high-brightness active matrix micro-light-emitting diode (micro-LED) display by using low-temperature polycrystalline oxide (LTPO) thin film transistors.

It is another object of the present disclosure to maximize the performance of a high-brightness active matrix micro-light-emitting diode (micro-LED) display by monitoring temperature inside a pixel in real time.

It is still another object of the present disclosure to provide a temperature sensor circuit only using low-temperature polycrystalline oxide (LTPO) thin film transistors without additional sensing components or materials based on change in off current between two types of thin film transistors at various temperatures.

It is still another object of the present disclosure to cover a temperature range of a temperature monitoring function according to overheating in the backplane of a display.

It is still another object of the present disclosure to adjust a high-sensitivity temperature range by controlling a bias voltage of an n-type oxide semiconductor thin film transistor among two types of thin film transistors to change in a balance point between the channel resistances of the two types of thin film transistors.

It is yet another object of the present disclosure to provide an active matrix temperature sensor array circuit manufactured using an integrated gate driver.

In accordance with one aspect of the present disclosure, provided is a temperature sensor circuit for measuring temperature inside a pixel of a display, the temperature sensor circuit including a first thin film transistor; a second thin film transistor interconnected with the first thin film transistor; and a temperature measurement unit for measuring temperature based on an output voltage according to difference in off current between the first thin film transistor and the second thin film transistor.

The first thin film transistor may include a p-type low-temperature polycrystalline silicon (LTPS) thin film transistor, the second thin film transistor may include an n-type oxide semiconductor thin film transistor, and the first thin film transistor and the second thin film transistor may be different types of thin film transistors.

The first thin film transistor may include a first drain terminal, a first gate terminal, and a first source terminal; the second thin film transistor may include a second drain terminal, a second gate terminal, and a second source terminal, and the second drain terminal may be interconnected with the first drain terminal to form a connection portion; and the first thin film transistor and the second thin film transistor may output an output voltage through the connection portion.

The first thin film transistor may receive a first bias voltage through the first gate terminal, the second thin film transistor may receive a second bias voltage through the second gate terminal, and the first bias voltage and the second bias voltage may be different types of bias voltages.

The first thin film transistor and the second thin film transistor may be set to off-states based on the different types of bias voltages.

In the first thin film transistor, the first gate terminal and the first source terminal may be connected to each other; and the second thin film transistor may receive a second bias voltage through the second gate terminal, or the second gate terminal and the second source terminal may be connected to each other.

The temperature sensor circuit may further include a third thin film transistor connected to the connection portion, wherein the third thin film transistor may include a third drain terminal, a third gate terminal, and a third source terminal and may control an output voltage according to a bias voltage applied to the third gate terminal.

The first thin film transistor and the second thin film transistor may have different channel lengths, and a channel length of the first thin film transistor may be shorter than a channel length of the second thin film transistor.

The temperature measurement unit may measure change in temperature according to change in magnitude of an output voltage proportional to magnitude of a drain voltage applied to the first thin film transistor.

The first thin film transistor may include a first channel layer formed on a buffer layer; a first drain electrode and a first source electrode disposed on both sides of the first channel layer; a first gate insulating layer formed on the first channel layer; and a first gate electrode formed on the first gate insulating layer.

The second thin film transistor may include a second gate insulating layer formed on the buffer layer; a second gate electrode formed on the second gate insulating layer; an intermediate layer formed on the second gate electrode; a second channel layer formed on the intermediate layer; a second drain electrode and a second source electrode formed on the second channel layer; a third gate insulating layer formed on the second drain electrode and the second source electrode; a third gate electrode formed on the third gate insulating layer; and a passivation layer formed on the third gate electrode.

The first gate electrode may be formed to share a metal layer with the second gate electrode, and the first drain electrode and the first source electrode may be formed to share a metal layer with the second drain electrode and the second source electrode.

4

In accordance with another aspect of the present disclosure, provided is a temperature sensor array circuit for measuring temperature inside a pixel of a display, the temperature sensor array circuit including the temperature sensor circuit according to claim 1 formed on a substrate; and a gate driver for selectively applying a gate voltage to the temperature sensor circuit, wherein the temperature sensor circuit is included in plural according to horizontal and vertical lengths of the temperature sensor array circuit.

In accordance with yet another aspect of the present disclosure, provided is a display apparatus including the temperature sensor circuit according to claim 1 formed on a substrate; and a display device electrically connected to the temperature sensor circuit, wherein the temperature sensor circuit is included in plural.

The display device may be an organic light-emitting device or an inorganic light-emitting device.

BRIEF DESCRIPTION OF THE DRAWINGS

The above and other objects, features and other advantages of the present disclosure will be more clearly understood from the following detailed description taken in conjunction with the accompanying drawings, in which:

FIG. 1 is a block diagram for explaining the components of a temperature sensor circuit according to one embodiment of the present disclosure;

FIGS. 2A to 2D are circuit diagrams for explaining the connection structure of a temperature sensor circuit according to one embodiment of the present disclosure;

FIG. 3 is an optical image of a temperature sensor circuit according to one embodiment of the present disclosure;

FIG. 4 illustrates the structure of a temperature sensor circuit according to one embodiment of the present disclosure;

FIG. 5A is a graph showing the transfer characteristics according to temperature change of a first thin film transistor according to one embodiment of the present disclosure;

FIG. 5B is a graph showing the transfer characteristics according to temperature change of a second thin film transistor according to one embodiment of the present disclosure;

FIGS. 6A to 6C are graphs showing the results of measuring temperature change using a temperature sensor circuit according to one embodiment of the present disclosure;

FIG. 7 includes images for explaining the results of measuring temperature change using a plurality of temperature sensor circuits according to one embodiment of the present disclosure;

FIG. 8 is a drawing for explaining the components of a temperature sensor array circuit according to one embodiment of the present disclosure;

FIG. 9 is an optical image of a temperature sensor array circuit according to one embodiment of the present disclosure; and FIGS. 10A and 10B are images for explaining the results of measuring temperature using a temperature sensor array circuit according to one embodiment of the present disclosure.

DETAILED DESCRIPTION OF THE DISCLOSURE

Hereinafter, preferred embodiments of the present disclosure will be described in detail with reference to the accompanying drawings.

It should be understood that the present disclosure is not limited to the embodiments according to the concept of the present disclosure, but includes changes, equivalents, or alternatives falling within the spirit and scope of the present disclosure.

In the following description of the present disclosure, detailed description of known functions and configurations incorporated herein will be omitted when it may make the subject matter of the present disclosure unclear.

In addition, the terms used in the specification are defined in consideration of functions used in the present disclosure, and can be changed according to the intent or conventionally used methods of clients, operators, and users. Accordingly, definitions of the terms should be understood on the basis of the entire description of the present specification.

In description of the drawings, like reference numerals may be used for similar elements.

The singular expressions in the present specification may encompass plural expressions unless clearly specified otherwise in context.

In this specification, expressions such as "A or B" and "at least one of A and/or B" may include all possible combinations of the items listed together.

Expressions such as "first" and "second" may be used to qualify the elements irrespective of order or importance, and are used to distinguish one element from another and do not limit the elements.

It will be understood that when an element (e.g., first) is referred to as being "connected to" or "coupled to" another element (e.g., second), it may be directly connected or coupled to the other element or an intervening element (e.g., third) may be present.

As used herein, "configured to" may be used interchangeably with, for example, "suitable for", "ability to", "changed to", "made to", "capable of", or "designed to" in terms of hardware or software.

In some situations, the expression "device configured to" may mean that the device "may do ~" with other devices or components.

For example, in the sentence "processor configured to perform A, B, and C", the processor may refer to a general purpose processor (e.g., CPU or application processor) capable of performing corresponding operation by running a dedicated processor (e.g., embedded processor) for performing the corresponding operation, or one or more software programs stored in a memory device.

In addition, the expression "or" means "inclusive or" rather than "exclusive or".

That is, unless mentioned otherwise or clearly inferred from context, the expression "x uses a or b" means any one of natural inclusive permutations.

Terms, such as "unit" or "module", etc., should be understood as a unit that processes at least one function or operation and that may be embodied in a hardware manner, a software manner, or a combination of the hardware manner and the software manner.

FIG. 1 is a block diagram for explaining the components of a temperature sensor circuit according to one embodiment of the present disclosure.

FIG. 1 illustrates the components of the temperature sensor circuit for measuring temperature inside a pixel of a display according to one embodiment of the present disclosure.

Referring to FIG. 1, a temperature sensor circuit 100 according to one embodiment of the present disclosure includes a first thin film transistor 110, a second thin film transistor 120, and a temperature measurement unit 130.

For example, the first thin film transistor 110 and the second thin film transistor 120 may be different types of thin film transistors, and low-temperature polycrystalline oxide (LTPO) thin film transistors may be formed based on the different types of thin film transistors.

According to one embodiment of the present disclosure, the first thin film transistor 110 may include a p-type low-temperature polycrystalline silicon (LTPS) thin film transistor.

For example, the p-type LTPS thin film transistor may have a channel layer formed of polycrystalline silicon, and may be formed through a blue laser annealing (BLA) process.

According to one embodiment of the present disclosure, the first thin film transistor 110 and the second thin film transistor 120 may have different channel lengths, and the channel length of the first thin film transistor 110 may be shorter than that of the second thin film transistor 120.

For example, the first thin film transistor 110 may be interconnected with the second thin film transistor 120. The first thin film transistor 110 and the second thin film transistor 120 may be controlled by different bias voltages and may operate in off-states.

According to one embodiment of the present disclosure, the second thin film transistor 120 may be interconnected with the first thin film transistor 110.

That is, the second thin film transistor 120 and the first thin film transistor 110 may share the drain terminals to form a connection portion through which the second thin film transistor 120 and the first thin film transistor 110 are interconnected, and may output an output voltage through the connection portion.

According to one embodiment of the present disclosure, the second thin film transistor 120 may include an n-type oxide semiconductor thin film transistor.

For example, the second thin film transistor 120 has a double-gate back channel etching (BCE) structure.

According to one embodiment of the present disclosure, the second thin film transistor 120 may use dual gates, thereby improving uniformity of a threshold voltage and channel mobility. Thereby, in addition to a temperature sensor circuit, an integrated circuit such as a gate driver may be easily formed.

According to one embodiment of the present disclosure, the first thin film transistor 110 and the second thin film transistor 120 may be set to off-states based on different types of bias voltages.

That is, the temperature sensor circuit 100 may measure temperature change inside a pixel of a display based on the off-states of the first thin film transistor 110 and the second thin film transistor 120.

That is, the temperature sensor circuit 100 may measure temperature change inside a pixel of a display using difference in off current based on the off-states of the first thin film transistor 110 and the second thin film transistor 120.

Accordingly, the present disclosure may provide a temperature sensor circuit only using low-temperature polycrystalline oxide (LTPO) thin film transistors without additional sensing components or materials based on change in off current between two types of thin film transistors at various temperatures.

For example, since the temperature sensor circuit 100 is biased in an off region, an output voltage may be determined by the channel resistance of the first thin film transistor 110 and the second thin film transistor 120.

According to one embodiment of the present disclosure, the temperature measurement unit 130 may measure temperature inside a pixel of a display based on an output voltage according to difference in off current between the first thin film transistor 110 and the second thin film transistor 120.

For example, the display may include a high-brightness active matrix micro-light-emitting diode (micro-LED) display.

That is, the temperature measurement unit 130 may measure an output voltage, match corresponding temperature to the measured output voltage, and provide the temperature measurement result as at least one of a number, a color, and a graph.

For example, the temperature measurement unit 130 may be a measurement device located outside the temperature sensor circuit 100.

According to one embodiment of the present disclosure, the temperature measurement unit 130 may measure temperature change according to change in the magnitude of an output voltage proportional to the magnitude of a drain voltage applied to the first thin film transistor.

Accordingly, the present disclosure may measure temperature change inside a pixel of the high-brightness active matrix micro-light-emitting diode (micro-LED) display by using the low-temperature polycrystalline oxide (LTPO) thin film transistors.

In addition, the present disclosure may maximize the performance of the high-brightness active matrix micro-light-emitting diode (micro-LED) display by monitoring temperature inside a pixel in real time.

FIGS. 2A to 2D are circuit diagrams for explaining the connection structure of a temperature sensor circuit according to one embodiment of the present disclosure.

FIG. 2A illustrates a connection structure of the temperature sensor circuit according to one embodiment of the present disclosure designed so that different types of thin film transistors receive different types of bias voltages.

Referring to FIG. 2A, a temperature sensor circuit 200 according to one embodiment of the present disclosure includes a first thin film transistor 201 and a second thin film transistor 202.

For example, the first thin film transistor 201 may include a first gate terminal, a first source terminal, and a first drain terminal and may receive a first bias voltage ($V_{PBIAS}$) through the first gate terminal.

According to one embodiment of the present disclosure, the second thin film transistor 202 may include a second gate terminal, a second source terminal, and a second drain terminal and may receive a second bias voltage ($V_{NBIAS}$) through the second gate terminal.

According to one embodiment of the present disclosure, the first thin film transistor 201 may be a p-type low-temperature polycrystalline silicon (LTPS) thin film transistor.

For example, the second thin film transistor 202 may be an n-type oxide semiconductor thin film transistor.

The first thin film transistor 201 and the second thin film transistor 202 may share drain terminals thereof.

That is, the first drain terminal of the first thin film transistor 201 and the second drain terminal of the second thin film transistor 202 may be interconnected to form a connection portion.

According to one embodiment of the present disclosure, the first thin film transistor 201 and the second thin film transistor 202 may provide an output voltage through the connection portion.

According to one embodiment of the present disclosure, the temperature sensor circuit 200 may receive a drain voltage through the first source terminal of the first thin film transistor 201.

Here, the magnitude of a drain voltage may be proportional to the magnitude of an output voltage, and the magnitude of an output voltage may be different depending on temperature inside a pixel of a display.

According to one embodiment of the present disclosure, the first thin film transistor 201 and the second thin film transistor 202 may receive a bias voltage to be set to an off-state.

FIG. 2B illustrates a connection structure of a temperature sensor circuit according to one embodiment of the present disclosure designed so that the gate terminal and the source terminal of a first thin film transistor among different types of thin film transistors are connected to each other and a second thin film transistor receives a bias voltage.

Referring to FIG. 2B, a temperature sensor circuit 210 includes a first thin film transistor 211 and a second thin film transistor 212.

For example, the first thin film transistor 211 may be a p-type low-temperature polycrystalline silicon (LTPS) thin film transistor.

According to one embodiment of the present disclosure, the second thin film transistor 212 may be an n-type oxide semiconductor thin film transistor.

The first thin film transistor 211 and the second thin film transistor 212 shares drain terminals thereof.

However, unlike the temperature sensor circuit 200 of FIG. 2A, a first gate terminal and a first source terminal of the first thin film transistor 211 are connected to each other, and the first thin film transistor 211 is operated according to a drain voltage.

In addition, the second thin film transistor 212 is operated by receiving a second bias voltage ($V_{NBIAS}$) through a second gate terminal.

Here, the second bias voltage ($V_{NBIAS}$) maintains the off-state of the second thin film transistor 212.

FIG. 2C illustrates a circuit structure of a temperature sensor circuit according to one embodiment of the present disclosure designed so that the gate terminal and the source terminal of a first thin film transistor among different types of thin film transistors are connected to each other, a second thin film transistor receives a bias voltage, and a third film transistor is connected to a connection portion of the first thin film transistor and the second thin film transistor to control the output of the temperature sensor circuit.

Referring to FIG. 2C, a temperature sensor circuit 220 includes a first thin film transistor 221, a second thin film transistor 222, and a third thin film transistor 223.

For example, the first thin film transistor 221 may be a p-type low-temperature polycrystalline silicon (LTPS) thin film transistor.

According to one embodiment of the present disclosure, the second thin film transistor 222 may be an n-type oxide semiconductor thin film transistor.

The first thin film transistor 221 and the second thin film transistor 222 share drain terminals thereof.

However, unlike the temperature sensor circuit 200 of FIG. 2A, a first gate terminal and a first source terminal of the first thin film transistor 221 are connected to each other, and the first thin film transistor 221 is operated according to a drain voltage.

In addition, the second thin film transistor 222 is operated by receiving a second bias voltage ($V_{NBIAS}$) through a second gate terminal.

Here, the second bias voltage ($V_{NBIAS}$) maintains the off-state of the second thin film transistor 222.

According to one embodiment of the present disclosure, the third thin film transistor 223 receives a gate voltage from a gate driver and operates in an on-state or an off-state to control an output voltage of the first thin film transistor 221 and the second thin film transistor 222.

FIG. 2D illustrates a circuit structure of a temperature sensor circuit according to one embodiment of the present disclosure designed so that a gate terminal and a source terminal of each of a first thin film transistor and a second thin film transistor among different types of thin film transistors are connected to each other and a third thin film transistor is connected to a connection portion of the first thin film transistor and the second thin film transistor to control the output of the temperature sensor circuit.

Referring to FIG. 2D, a temperature sensor circuit 230 includes a first thin film transistor 231, a second thin film transistor 232, and a third thin film transistor 233.

For example, the first thin film transistor 231 may be a p-type low-temperature polycrystalline silicon (LTPS) thin film transistor.

According to one embodiment of the present disclosure, the second thin film transistor 232 may be an n-type oxide semiconductor thin film transistor.

The first thin film transistor 231 and the second thin film transistor 232 share drain terminals thereof.

According to one embodiment of the present disclosure, the third thin film transistor 233 includes a third drain terminal, a third source terminal, and a third gate terminal, and operation of the third thin film transistor 233 is controlled by a bias voltage applied to the third gate terminal.

According to one embodiment of the present disclosure, the third thin film transistor 233 receives a gate voltage from a gate driver and operates in an on-state or an off-state to control an output voltage of the first thin film transistor 231 and the second thin film transistor 232.

That is, the third thin film transistor 233 controls an output voltage according to a bias voltage applied to the third gate terminal.

According to one embodiment of the present disclosure, the temperature sensor circuit 220 and the temperature sensor circuit 230 may be used as a temperature sensor array circuit.

FIG. 3 is an optical image of a temperature sensor circuit according to one embodiment of the present disclosure.

Referring to FIG. 3, a temperature sensor circuit 300 is composed of two different types of thin film transistors having different channel lengths.

According to one embodiment of the present disclosure, the temperature sensor circuit 300 may be composed of a first thin film transistor and a second thin film transistor. In this case, the channel width and length of the first thin film transistor may be 20 μm and 6 μm, respectively, and the channel width and length of the second thin film transistor may be 200 μm and 6 μm, respectively.

That is, the channel width of the second thin film transistor is greater than that of the first thin film transistor, and the channel width ratio of the second thin film transistor to the first thin film transistor is 10:1. By increasing the initial resistance matching between the two thin film transistors, most sensitivity over a sensing temperature range may be improved.

FIG. 4 illustrates the structure of a temperature sensor circuit according to one embodiment of the present disclosure.

Referring to FIG. 4, a temperature sensor circuit 400 according to one embodiment of the present disclosure may have a coplanar structure including a first thin film transistor 430 and a second thin film transistor 440. The first thin film transistor 430 and the second thin film transistor 440 may be disposed on a buffer layer 420 disposed on a substrate 410.

In the first thin film transistor 430, a first channel layer 431 may be formed on the buffer layer 420, a source electrode 432 and a drain electrode 433 may be disposed on both sides of the first channel layer 431, a first gate insulating layer 434 may be disposed on the first channel layer 431, and a first gate electrode may be disposed on the first gate insulating layer 434.

Meanwhile, in the second thin film transistor 440, a second gate insulating layer 441 may be formed on the buffer layer 420, a second gate electrode 442 may be formed on the second gate insulating layer 441, an intermediate layer 443 may be disposed between a second channel layer 444 and the second gate electrode 442, a source electrode 445 and a drain electrode 446 may be disposed on the second channel layer 444, a third gate insulating layer 447 may be disposed on the second channel layer 444, the source electrode 445, and the drain electrode 446, a third gate electrode 448 may be disposed on the third gate insulating layer 447, and a passivation layer 449 may be disposed on the third gate electrode 448.

The substrate 410 may be a flexible substrate for supporting the components of the first thin film transistor 430 and the second thin film transistor 440.

The flexible substrate may be bent or folded in a specific direction. For example, the flexible substrate may be folded in a horizontal direction, a vertical direction, or an oblique direction.

The substrate 410 may be formed of any one selected from the group consisting of glass, polyimide-based polymers, polyester-based polymers, silicon-based polymers, acrylic polymers, polyolefin-based polymers, and copolymers thereof.

When a flexible substrate is used as the substrate 410, for example, the substrate 410 may be formed of any one selected from the group consisting of polyester, polyvinyl, polycarbonate, polyethylene, polyacetate, polyimide, polyethersulphones (PES), polyacrylates (PAR), polyethylenenaphthelate (PEN), and polyethyleneterephehalate (PET).

According to one embodiment, when a display apparatus including an oxide semiconductor thin film transistor is implemented as a transparent flexible display apparatus, the substrate 410 may be formed of a transparent flexible material.

The substrate 410 may include one or more thin film transistor regions. Thin film transistors (TFT) may be disposed at the thin film transistor regions. The thin film transistor regions may be disposed in a matrix form on the substrate 410.

The first gate electrode 435 and the second gate electrode 442 may be formed of the same metal material, and for example, may be formed of molybdenum (Mo), aluminum (Al), chromium (Cr), gold (Au), titanium (Ti), nickel (Ni), neodymium (Nd), copper (Cu), or a combination thereof, without being limited thereto. In addition, the first gate electrode 435 and the second gate electrode 442 may be formed in a single-layer or multilayer structure including the above-described material.

The first gate electrode 435 and the second gate electrode 442 may be formed using at least one of vacuum deposition, chemical vapor deposition, physical vapor deposition, atomic layer deposition, metal organic chemical vapor deposition, plasma-enhanced chemical vapor deposition, molecular beam epitaxy, hydride vapor phase epitaxy, sputtering, spin coating, dip coating, and zone casting.

In addition, the first gate electrode 435 and the second gate electrode 442 may be formed to share the same metal layer.

In addition, the source electrode 432 and the drain electrode 433 of the first thin film transistor 430 and the source electrode 445 과 the drain electrode 446 of the second thin film transistor 440 may be formed to share the same metal layer.

In addition, the drain electrode 433 of the first thin film transistor 430 is interconnected with the drain electrode 446 of the second thin film transistor 440.

Accordingly, the temperature sensor circuit 400 may reduce cost and the number of photo masks due to process simplification.

According to one embodiment of the present disclosure, the first channel layer 431 may be formed of polycrystalline silicon, and the second channel layer 444 may be formed of indium gallium zinc oxide (IGZO).

According to one embodiment of the present disclosure, the width ratio of the first channel layer 431 to the second channel layer 444 may be 1:10.

For example, the first gate insulating layer 434 may insulate the first gate electrode 435 and the first channel layer 431.

That is, the first thin film transistor 430 may include the first channel layer 431 formed on the buffer layer 420, the first drain electrode 433 and the first source electrode 432 disposed on both sides of the first channel layer 431, the first gate insulating layer 434 formed on the first channel layer 431, and the first gate electrode 435 formed on the first gate insulating layer 434.

In addition, the second thin film transistor 440 may include the second gate insulating layer 441 formed on the buffer layer 420, the second gate electrode 442 formed on the second gate insulating layer 441, the intermediate layer 443 formed on the second gate electrode 442, the second channel layer 444 formed on the intermediate layer 443, the second drain electrode 445 and the second source electrode 446 formed on the second channel layer 444, the third gate insulating layer 447 formed on the second drain electrode 445 and the second source electrode 446, the third gate electrode 448 formed on the third gate insulating layer 447, and the passivation layer 449 formed on the third gate electrode 448.

FIG. 5A is a graph showing the transfer characteristics according to temperature change of a first thin film transistor according to one embodiment of the present disclosure.

Referring to FIG. 5A, a graph 500 shows change in drain current depending on gate voltages in association with temperature change.

As shown in the graph 500, when a negative bias voltage is applied to a gate terminal of a first thin film transistor, the first thin film transistor exhibits about −3 A to −4 A. When a positive bias voltage is applied, the first thin film transistor exhibits about −9 A to −12.5 A depending on temperature change, i.e., exhibits subdivided drain current output features.

FIG. 5B is a graph showing the transfer characteristics according to temperature change of a second thin film transistor according to one embodiment of the present disclosure.

Referring to FIG. 5B, a graph 510 shows change in drain current depending on gate voltages in association with temperature change.

As shown in the graph 510, when a negative bias voltage is applied to a gate terminal of a second thin film transistor, the second thin film transistor exhibits about −12.5 A to −14 A. When a positive bias voltage is applied, the second thin film transistor exhibits a linear pattern of change depending on gate voltages regardless of temperature change.

Accordingly, the second thin film transistor is biased to a negative potential to remain an off-state.

FIGS. 6A to 6C are graphs showing the results of measuring temperature change using a temperature sensor circuit according to one embodiment of the present disclosure.

FIG. 6A shows the results of measuring temperature change using a temperature sensor circuit according to one embodiment of the present disclosure. Specifically, change in an output voltage is measured while sweeping a drain voltage ($V_{DD}$) from 0 V to 15 V in a temperature range of room temperature (RT) to 80° C.

As shown in a graph 600 of FIG. 6A, the drain voltage ($V_{DD}$) and the output voltage are proportional, but different output voltages are measured according to temperature change.

For example, at the same drain voltage ($V_{DD}$) of 8 V, an output voltage is 4 V at 30° C., but an output voltage is 8 V at 80° C.

That is, as temperature increases, an output voltage similar to the input drain voltage ($V_{DD}$) may be measured by the temperature sensor circuit.

FIG. 6B shows the results of measuring temperature change using a temperature sensor circuit according to one embodiment of the present disclosure. Specifically, output voltages vs temperatures are shown at three different drain voltages ($V_{DD}$) of 5 V, 10 V, and 15 V.

Referring to FIG. 6B, a graph 610 shows the voltage sensitivity of the temperature sensor circuit according to output voltage vs temperature change at three different supply voltages of 5 V, 10 V, and 15 V.

As shown in the graph 610, when a drain voltage is 5 V, a voltage sensitivity of 63.2 mV/degree is exhibited. When a drain voltage is 10 V, a voltage sensitivity of 71.5 mV/degree is exhibited. When a drain voltage is 15 V, a voltage sensitivity of 71.8 mV/degree is exhibited.

FIG. 6B shows the results of measuring temperature change using a temperature sensor circuit according to one embodiment of the present disclosure. Specifically, voltage sensitivity is shown at three different drain voltages ($V_{DD}$) of 5 V, 10 V, and 15 V.

Referring to FIG. 6C, a graph 620 shows voltage sensitivity according to change in temperature and an output voltage.

As shown in the graph 620, as a drain voltage increases, an output voltage and voltage sensitivity increase.

For example, at all three different drain voltages ($V_{DD}$) of 5 V, 10 V, and 15 V, the highest output voltage and voltage sensitivity are observed at 30° C.

The temperature sensor circuit according to one embodiment of the present disclosure may have temperature sensitivity showing excellent linearity from 30° C. to about 60° C.

Here, the off current of the first thin film transistor unit may exist within the same size as the second thin film transistor unit having a channel width of 10 times.

For example, in the temperature sensor circuit, when temperature exceeds 60° C., the channel resistance of the first thin film transistor becomes too low and output linearity is improved, and thus an output curve may start to saturate.

In addition, the temperature sensor circuit exhibits a sensitivity of 71.8 mV/° C. at a drain voltage of 15 V, and may be superior to other large area temperature sensors or commercial temperature sensors according to the prior art.

FIG. 7 includes images for explaining the results of measuring temperature change using a plurality of temperature sensor circuits according to one embodiment of the present disclosure.

FIG. 7 includes mapping images obtained by mapping the output voltages of eight temperature sensors distributed on 20 mm×20 mm glass substrates having different temperatures according to one embodiment of the present disclosure.

Referring to FIG. 7, a first mapping image 700 represents a case wherein the temperature of the substrate is about 23° C., a second mapping image 710 represents a case wherein the temperature of the substrate is about 40° C., and a third mapping image 720 represents a case wherein the temperature of the substrate is about 80° C.

Specifically, in the first mapping image 700 to the third mapping image 720, in the eight temperature sensor array circuits, temperature sensor circuits may be arranged in a 2×4 layout.

Referring to the first mapping image 700, a voltage of about 5 V to 7 V may be measured from a substrate.

Referring to the second mapping image 710, a voltage of about 8 V to 9 V may be measured from a substrate, and an output deviation between temperature sensor circuits may be reduced at a temperature of 40° C.

Referring to the third mapping image 720, a voltage of about 10 V may be measured from a substrate. At 80° C., all eight temperature sensor circuits are saturated, indicating that the uniformity of output increases with increasing temperature.

Here, the process uniformity of the first thin film transistor may be verified. Since the temperature sensor circuits use the off-state regions of the first thin film transistor and the second thin film transistor rather than the on-state regions thereof, an output value is very sensitive to an initial channel resistance, so an output voltage distribution range may be relatively wider at low temperatures compared to high temperatures.

FIG. 8 is a drawing for explaining the components of a temperature sensor array circuit according to one embodiment of the present disclosure.

Referring to FIG. 8, a temperature sensor array circuit 800 according to one embodiment of the present disclosure includes a sensor array unit 810 and a gate driver 820. The sensor array unit 810 includes a plurality of temperature sensor circuits, and the temperature sensor circuits include a temperature sensor circuit 811.

In FIG. 8, the sensor array unit 810 is composed of a plurality of temperature sensor circuits in a 64×64 array, but the configuration of the sensor array unit 810 may be changed according to the area of a substrate to be measured.

For example, a plurality of temperature sensor circuits may be arranged to correspond to a plurality of pixels constituting a display apparatus.

The temperature sensor circuit 811 according to one embodiment of the present disclosure may correspond to the temperature sensor circuit 220 and the temperature sensor circuit 230 described in FIGS. 2C and 2D.

For example, the temperature sensor circuit 811 may include a first thin film transistor, a second thin film transistor, and a third thin film transistor, and an output voltage may be controlled according to the output bias of the gate driver 820 connected to the gate terminal of the third thin film transistor.

According to one embodiment of the present disclosure, the sensor array unit 810 may output an output voltage related to temperature change in all regions in which temperature sensor circuits are disposed, and the output voltage may be controlled according to the bias voltage of the gate driver 820.

That is, the gate driver 820 may selectively apply a gate voltage to the temperature sensor circuit 811.

According to one embodiment of the present disclosure, the sensor array unit 810 may include a plurality of temperature sensor circuits along the horizontal and vertical lengths of the temperature sensor array circuit.

FIG. 9 is an optical image of a temperature sensor array circuit according to one embodiment of the present disclosure.

FIG. 9 shows an optical image of an exemplary temperature sensor array circuit according to one embodiment of the present disclosure.

Referring to FIG. 9, a temperature sensor array circuit 900 according to one embodiment of the present disclosure may correspond to the temperature sensor array circuit 800 of FIG. 8.

An optical image 910 shows a temperature sensor circuit constituting the temperature sensor array circuit.

The optical image of the temperature sensor array circuit 900 may be an optical image of a 64×64 active matrix LTPO temperature sensor array integrated with a gate driver.

The present disclosure may provide an active matrix temperature sensor array circuit manufactured using an integrated gate driver.

FIGS. 10A and 10B are images for explaining the results of measuring temperature using a temperature sensor array circuit according to one embodiment of the present disclosure.

FIGS. 10A and 10B are images showing temperature measurement results obtained after contacting a hot object on the temperature sensor array circuit described in FIGS. 8 and 9.

Here, the area in contact with the hot object may be related to a situation in which overheating occurs in the backplane of a display.

Referring to an optical image 1000 of FIG. 10A, an area in contact with the hot object is derived and displayed as an image corresponding to the temperature of the object.

The optical image 1000 shows raw readout results with enhanced contrast.

In an optical image 1010 of FIG. 10B, the result of subtracting background data from raw read data in the image 1000 is shown.

Referring to the optical image 1010, an area in contact with the hot object is more clearly visible.

The ranges of raw read data of the optical image 1000 and the optical image 1010 are the same, showing a range of 0 to 250.

That is, the temperature sensor circuit according to one embodiment of the present disclosure may provide a temperature monitoring function for the backplane of a display.

Accordingly, the present disclosure may cover a temperature range of a temperature monitoring function according to overheating in the backplane of a display.

The temperature sensor circuit and the method of manufacturing the same have been described. In addition, the temperature sensor array circuit including a plurality of temperature sensor circuits has been described, and the display apparatus using the same and the method of manufacturing the display apparatus may be within the scope the present disclosure.

Specifically, in the temperature sensor circuits according to embodiments of the present disclosure, an oxide thin film semiconductor may be used as a pixel element of a flexible display device such as a liquid crystal display device (LCD) or an organic light-emitting display device (AMOLED).

More specifically, after a temperature sensor circuit is manufactured using the above-described method, a step of forming a pixel electrode electrically connected to any one of a source electrode and a drain electrode may be performed to manufacture a display apparatus.

For example, as shown in FIG. 4, in the method of manufacturing a display apparatus according to one embodiment of the present disclosure, a passivation layer for covering source and drain electrodes may be formed, and a pixel electrode connected to the drain electrode through the through-hole of the passivation layer may be formed.

In addition, in the method of manufacturing a display apparatus according to one embodiment of the present disclosure, an organic light-emitting display apparatus or a micro organic light-emitting display apparatus may be manufactured by forming an intermediate layer including a light-emitting layer on a pixel electrode and forming a counter electrode thereon.

Accordingly, according to the present disclosure, an oxide semiconductor thin film transistor having high performance electrical properties may be used as the pixel element of a flexible display device such as a liquid crystal display device (LCD) or an organic light-emitting display device (AMOLED).

That is, the display apparatus according to one embodiment of the present disclosure may include a plurality of temperature sensor circuits and a display device connected to the temperature sensor circuits. The display device may be an organic light-emitting device or an inorganic light-emitting device.

The present disclosure can measure temperature change inside a pixel of a high-brightness active matrix micro-light-emitting diode (micro-LED) display by using low-temperature polycrystalline oxide (LTPO) thin film transistors.

The present disclosure can maximize the performance of a high-brightness active matrix micro-light-emitting diode (micro-LED) display by monitoring temperature inside a pixel in real time.

The present disclosure can provide a temperature sensor circuit only using low-temperature polycrystalline oxide (LTPO) thin film transistors without additional sensing components or materials based on change in off current between two types of thin film transistors at various temperatures.

The present disclosure can cover a temperature range of a temperature monitoring function according to overheating in the backplane of a display.

The present disclosure can adjust a high-sensitivity temperature range by controlling a bias voltage of an n-type oxide semiconductor thin film transistor among two types of thin film transistors to change in a balance point between the channel resistances of the two types of thin film transistors.

The present disclosure can provide an active matrix temperature sensor array circuit manufactured using an integrated gate driver.

The methods according to claims of the present disclosure or the embodiments described in the specification may be implemented in hardware, software, or a combination of hardware and software.

The software may be stored in a computer-readable storage medium. When executed by at least one program (software module) or at least one processor, the computer-readable storage medium stores at least one program that includes instructions that cause the electronic device to perform the method of the present disclosure.

Such software may be stored on optical or magnetic readable media, such as compact disc-ROM (CD-ROM), digital versatile discs (DVDs), magnetic disks, or magnetic tapes, in the form of a volatile storage device or a non-volatile storage device such as read only memory (ROM), or in the form of a memory such as random access memory (RAM), memory chips, or integrated circuits.

The storage device and medium are machine-readable storage means suitable for storing programs including instructions for implementing embodiments when executed.

In the above-described specific embodiments, elements included in the disclosure are expressed in singular or plural in accordance with the specific embodiments.

However, the singular or plural representations are appropriately selected for the situation presented for convenience of explanation, and the above-described embodiments are not limited to the singular or plural constituent elements. In addition, elements may be composed of the singular number, even when the elements are expressed in the plural number, and an element may be composed of the plural number, even when the element is expressed in the singular number.

In addition, the present disclosure has been described with reference to exemplary embodiments, but it should be understood that various modifications may be made without departing from the scope of the present disclosure.

Therefore, the scope of the present disclosure should not be limited by the embodiments, but should be determined by the following claims and equivalents to the following claims.

DESCRIPTION OF SYMBOLS

100: TEMPERATURE SENSOR CIRCUIT
110: FIRST THIN FILM TRANSISTOR
120: SECOND THIN FILM TRANSISTOR
130: TEMPERATURE MEASUREMENT UNIT

What is claimed is:

1. A temperature sensor circuit for measuring temperature inside a pixel of a display, the circuit comprising:

a first thin film transistor;

a second thin film transistor interconnected with the first thin film transistor; and a temperature measurement unit for measuring temperature based on an output voltage according to difference in off current between the first thin film transistor and the second thin film transistor, wherein the first thin film transistor and the second thin film transistor are different types of thin film transistors, wherein the first thin film transistor comprises a first drain terminal, a first gate terminal, and a first source terminal, wherein the second thin film transistor comprises a second drain terminal, a second gate terminal, and a second source terminal, and the second drain terminal is interconnected with the first drain terminal to form a connection portion, wherein the first thin film transistor and the second thin film transistor output an output voltage through the connection portion, wherein the first thin film transistor receives a first bias voltage ($V_{PBIAS}$) through the first gate terminal, wherein the second thin film transistor receives a second bias voltage ($V_{NBIAS}$) through the second gate terminal wherein the first thin film transistor is set to an off state based on the first bias voltage ($V_{PBIAS}$), wherein the second thin film transistor is set to an off state based on the second bias voltage ($V_{NBIAS}$), wherein the first bias voltage ($V_{PBIAS}$) is a p-type bias voltage, wherein the second bias voltage ($V_{NBIAS}$) is an n-type bias voltage, wherein the first gate terminal is connected to a source of the first bias voltage ($V_{PBIAS}$), wherein the second gate terminal is connected to a source of the second bias voltage ($V_{NBIAS}$), wherein the first thin film transistor comprises a p-type low-temperature polycrystalline silicon (LTPS) thin film transistor, wherein the second thin film transistor comprises an n-type oxide semiconductor thin film transistor, wherein the first drain terminal is connected to a source of a drain voltage, wherein the connection portion outputs the output voltage changed by the drain voltage and the temperature, wherein a change of the drain voltage changes the output voltage with the temperature and a voltage sensitivity, wherein the first thin film transistor and the second thin film transistor have different channel lengths and channel widths, and a channel length of the first thin film transistor is shorter than a channel length of the second thin film transistor, a channel width of the second thin film transistor is greater than a channel width of the first thin film transistor, and the channel width ratio of the second thin film transistor to the first thin film transistor is 10:1.

2. The temperature sensor circuit according to claim 1, wherein, in the first thin film transistor, the first gate terminal and the first source terminal are connected to each other; and the second thin film transistor receives a second bias voltage through the second gate terminal, or the second gate terminal and the second source terminal are connected to each other.

3. The temperature sensor circuit according to claim 2, further comprising a third thin film transistor connected to the connection portion, wherein the third thin film transistor comprises a third drain terminal, a third gate terminal, and a third source terminal and controls an output voltage according to a bias voltage applied to the third gate terminal.

4. The temperature sensor circuit according to claim 1, wherein the temperature measurement unit measures change in temperature according to change in magnitude of an output voltage proportional to magnitude of the drain voltage applied to the first thin film transistor.

5. The temperature sensor circuit according to claim 1, wherein the first thin film transistor comprises a first channel layer formed on a buffer layer;

a first drain electrode and a first source electrode disposed on both sides of the first channel layer;

a first gate insulating layer formed on the first channel layer; and a first gate electrode formed on the first gate insulating layer.

6. The temperature sensor circuit according to claim 5, wherein the second thin film transistor comprises a second gate insulating layer formed on the buffer layer;

a second gate electrode formed on the second gate insulating layer;

an intermediate layer formed on the second gate electrode;

a second channel layer formed on the intermediate layer;

a second drain electrode and a second source electrode formed on the second channel layer;

a third gate insulating layer formed on the second drain electrode and the second source electrode;

a third gate electrode formed on the third gate insulating layer; and a passivation layer formed on the third gate electrode.

7. The temperature sensor circuit according to claim 6, wherein the first gate electrode is formed to share a metal layer with the second gate electrode, and the first drain electrode and the first source electrode are formed to share a metal layer with the second drain electrode and the second source electrode.

8. A temperature sensor array circuit for measuring temperature inside a pixel of a display, the circuit comprising:

the temperature sensor circuit according to claim 1 formed on a substrate; and a gate driver for selectively applying a gate voltage to the temperature sensor circuit, wherein the temperature sensor circuit is comprised in plural according to horizontal and vertical lengths of the temperature sensor array circuit.

9. A display apparatus comprising:

the temperature sensor circuit according to claim 1 formed on a substrate; and a display device electrically connected to the temperature sensor circuit, wherein the temperature sensor circuit is comprised in plural.

10. The display apparatus according to claim 9, wherein the display device is an organic light-emitting device or an inorganic light-emitting device.

11. A temperature sensor array circuit for measuring temperature inside a pixel of a display, the circuit comprising:

the temperature sensor circuit according to claim 1 formed on a substrate; and a gate driver for selectively applying a gate voltage to the temperature sensor circuit, wherein the temperature sensor circuit is comprised in plural according to horizontal and vertical lengths of the temperature sensor array circuit.

12. A temperature sensor array circuit for measuring temperature inside a pixel of a display, the circuit comprising:

the temperature sensor circuit according to claim 1 formed on a substrate; and a gate driver for selectively applying a gate voltage to the temperature sensor circuit, wherein the temperature sensor circuit is comprised in plural according to horizontal and vertical lengths of the temperature sensor array circuit.

13. A temperature sensor array circuit for measuring temperature inside a pixel of a display, the circuit comprising:

the temperature sensor circuit according to claim 4 formed on a substrate; and a gate driver for selectively applying a gate voltage to the temperature sensor circuit, wherein the temperature sensor circuit is comprised in plural according to horizontal and vertical lengths of the temperature sensor array circuit.

14. A temperature sensor array circuit for measuring temperature inside a pixel of a display, the circuit comprising:

the temperature sensor circuit according to claim 5 formed on a substrate; and a gate driver for selectively applying a gate voltage to the temperature sensor circuit, wherein the temperature sensor circuit is comprised in plural according to horizontal and vertical lengths of the temperature sensor array circuit.

15. A display apparatus comprising:

the temperature sensor circuit according to claim 1 formed on a substrate; and a display device electrically connected to the temperature sensor circuit, wherein the temperature sensor circuit is comprised in plural.

16. A display apparatus comprising:

the temperature sensor circuit according to claim 8 formed on a substrate; and a display device electrically connected to the temperature sensor circuit, wherein the temperature sensor circuit is comprised in plural.

17. A display apparatus comprising:

the temperature sensor circuit according to claim 9 formed on a substrate; and a display device electrically connected to the temperature sensor circuit, wherein the temperature sensor circuit is comprised in plural.

18. A display apparatus comprising:

the temperature sensor circuit according to claim 10 formed on a substrate; and a display device electrically connected to the temperature sensor circuit, wherein the temperature sensor circuit is comprised in plural.

* * * * *